(12) United States Patent
Nagayama et al.

(10) Patent No.: US 8,928,396 B2
(45) Date of Patent: Jan. 6, 2015

(54) ELECTRONIC CIRCUIT AND SEMICONDUCTOR DEVICE

(71) Applicant: Fujitsu Semiconductor Limited, Yokohama-shi, Kanagawa (JP)

(72) Inventors: Jun Nagayama, Yokohama (JP); Tomoharu Awaya, Akisima (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/013,578

(22) Filed: Aug. 29, 2013

(65) Prior Publication Data

US 2014/0111181 A1  Apr. 24, 2014

(30) Foreign Application Priority Data

Oct. 22, 2012  (JP) ................. 2012-233171

(51) Int. Cl.
| | |
|---|---|
| *H03K 3/01* | (2006.01) |
| *G05F 1/10* | (2006.01) |
| *G05F 3/02* | (2006.01) |
| *G05F 3/16* | (2006.01) |
| *H02M 1/14* | (2006.01) |
| *H02M 7/48* | (2006.01) |

(52) U.S. Cl.
CPC . *G05F 3/16* (2013.01); *H02M 1/14* (2013.01); *H02M 7/48* (2013.01)
USPC ............ 327/537; 327/541; 327/530; 327/534

(58) Field of Classification Search
USPC .......................... 327/530, 534–538, 540–543
See application file for complete search history.

(56) References Cited

U.S. PATENT DOCUMENTS

| | | | | |
|---|---|---|---|---|
| 5,307,315 | A * | 4/1994 | Oowaki et al. ........... | 365/189.09 |
| 6,456,155 | B2 * | 9/2002 | Takai .............................. | 327/541 |
| 6,867,637 | B2 * | 3/2005 | Miyazaki et al. .............. | 327/534 |
| 6,876,251 | B2 * | 4/2005 | Watanabe ...................... | 327/541 |
| 7,830,203 | B2 * | 11/2010 | Chang et al. ................... | 327/544 |
| 2007/0109039 | A1 | 5/2007 | Watanabe | |
| 2008/0143423 | A1 * | 6/2008 | Komatsu et al. .............. | 327/534 |

FOREIGN PATENT DOCUMENTS

| | | |
|---|---|---|
| JP | 1-253264 A | 10/1989 |
| JP | 2007-128395 A | 5/2007 |
| JP | 2008-227155 A | 9/2008 |
| JP | 2009-44220 A | 2/2009 |

* cited by examiner

*Primary Examiner* — Lincoln Donovan
*Assistant Examiner* — Thomas Skibinski
(74) *Attorney, Agent, or Firm* — Arent Fox LLP

(57) ABSTRACT

An electronic circuit includes: first circuits each including a first FET having a source supplied with at least one of a first voltage and a second voltage; and a second circuits each of which is associated with a respective one of the first circuits, and generates a back bias voltage applied to the first FET so as to change in accordance with a change of at least one of the first and second voltages.

15 Claims, 10 Drawing Sheets

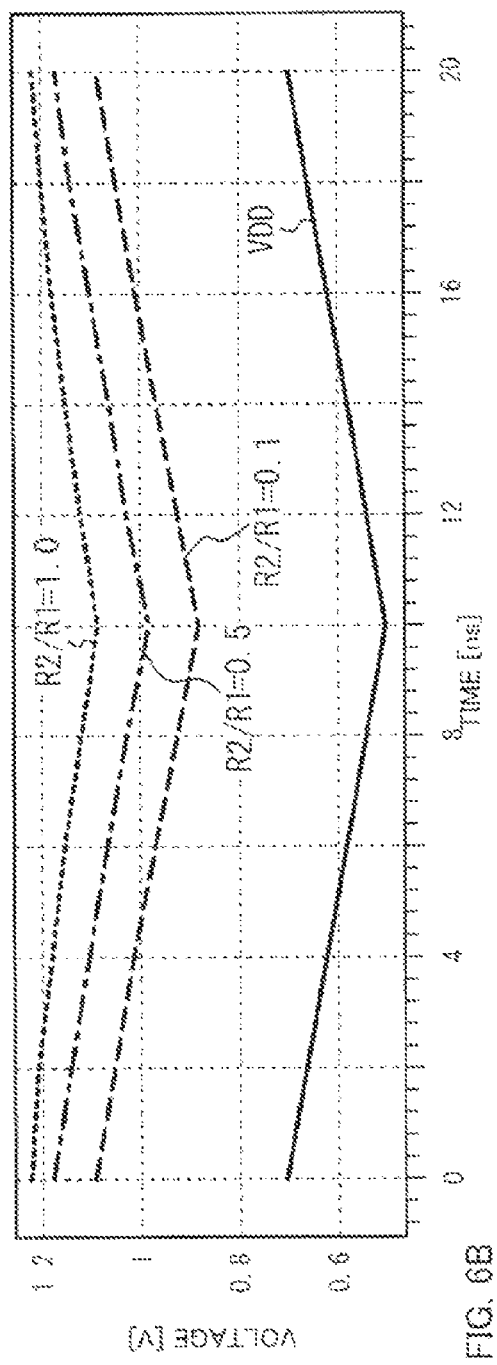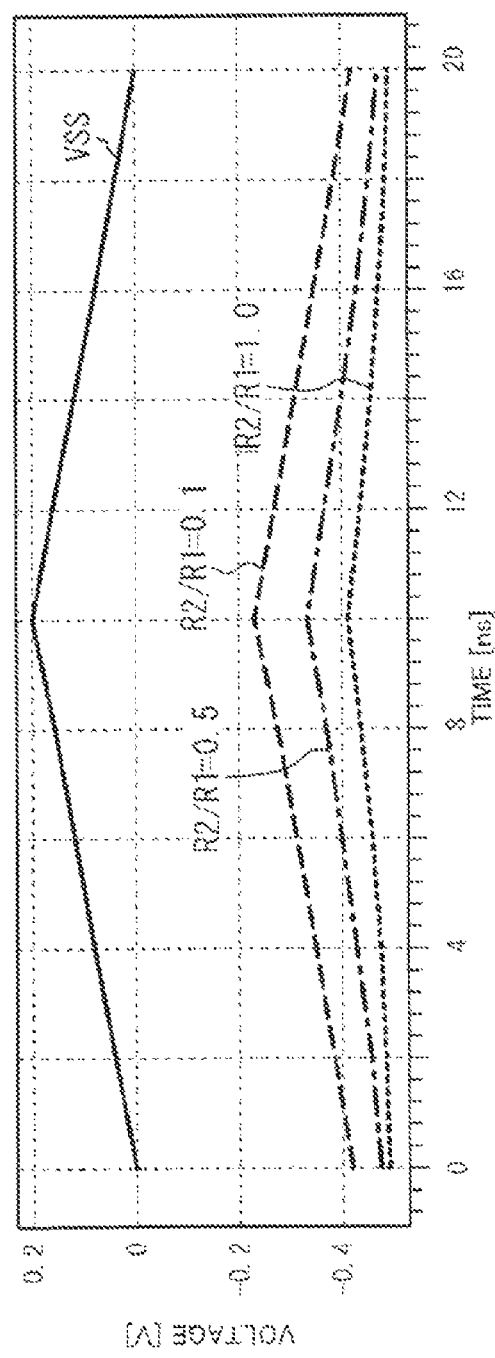

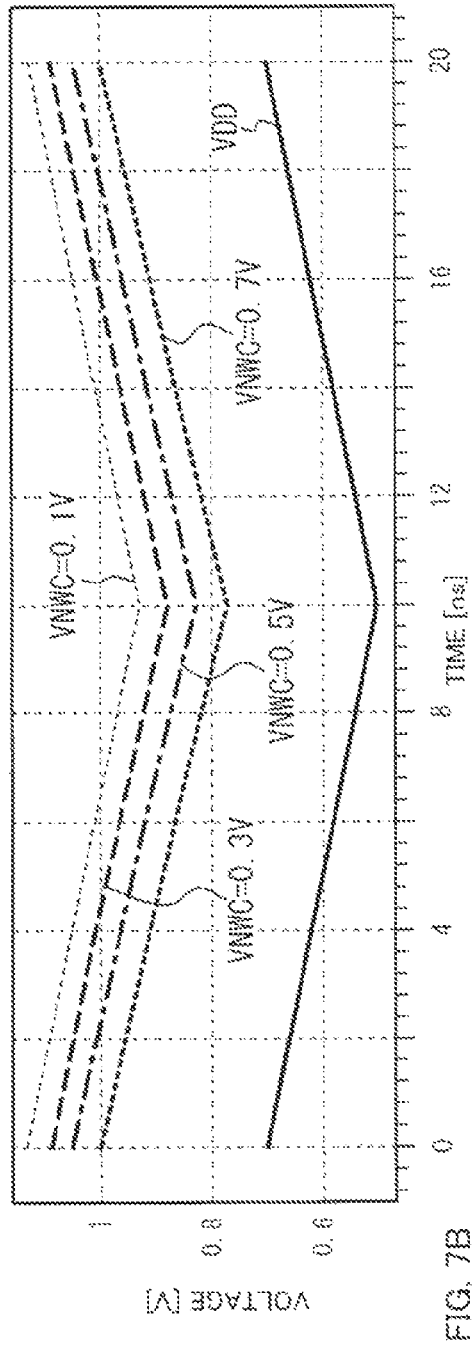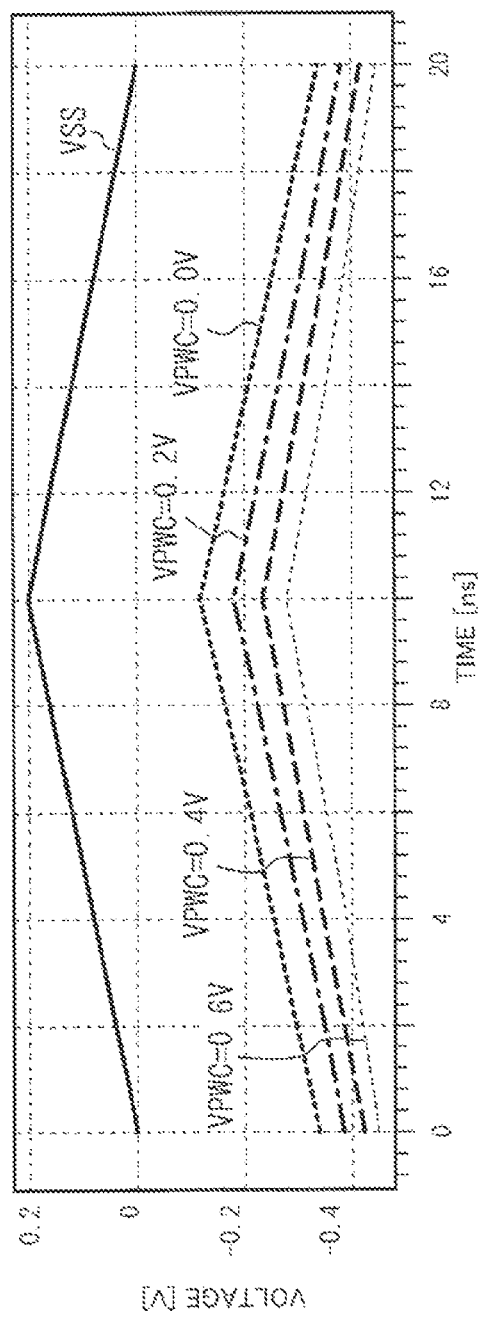

US 8,928,396 B2

ELECTRONIC CIRCUIT AND SEMICONDUCTOR DEVICE

CROSS-REFERENCE TO RELATED APPLICATION

This application is based upon and claims the benefit of priority of the prior Japanese Patent Application No. 2012-233171, filed on Oct. 22, 2012, the entire contents of which are incorporated herein by reference.

FIELD

A certain aspect of the embodiments discussed herein is related to an electronic circuit and a semiconductor device.

BACKGROUND

A drop of the power supply voltage that depends on the position on a chip occurs due to the resistance of the power supply line. Therefore, transistors in different positions in the chip have different characteristics. A semiconductor device directed to suppressing the occurrence of different characteristics is known in which the chip is divided into blocks of circuit, and the back bias voltages applied to FETs (Field Effect Transistors) in the blocks are controllable on the block basis (see Japanese Laid-Open Patent Publication No. 2008-227155, for example).

There is known a circuit that generates a reference voltage that is changed in accordance of fluctuations in the power supply voltage (see Japanese Laid-Open Patent Publication No. 2007-128395, for example).

SUMMARY

According to an aspect of the present invention, there is provided an electronic circuit including: first circuits each including a first FET having a source supplied with at least one of a first voltage and a second voltage; and second circuits each of which is associated with a respective one of the first circuits, and generates a back bias voltage applied to the first FET so as to change in accordance with a change of at least one of the first and second voltages.

The object and advantages of the invention will be realized and attained by means of the elements and combinations particularly jointed out in the claims.

It is to be understood that both the foregoing general description and the following detailed description are exemplary and explanatory and are not restrictive of the invention, as claimed.

BRIEF DESCRIPTION OF DRAWINGS

FIGS. 6A and 6B are diagrams that illustrate simulation results of the second circuit;
FIGS. 7A and 7B are diagrams that illustrate simulation results of the second circuit;

DESCRIPTION OF EMBODIMENTS

In order to separately control the back bias voltages for each of the circuits in accordance with the drop of the power supply voltage, the back bias voltages to be applied may be prepared for each of the circuits. However, this preparation uses a complex circuit of controlling the back bias voltages. According to an aspect of embodiments described hereinafter, the circuit that controls the back bias voltages for each circuit is simplified.

Now, a description is given of embodiments with reference to the drawings.

First Embodiment

Figure 1:
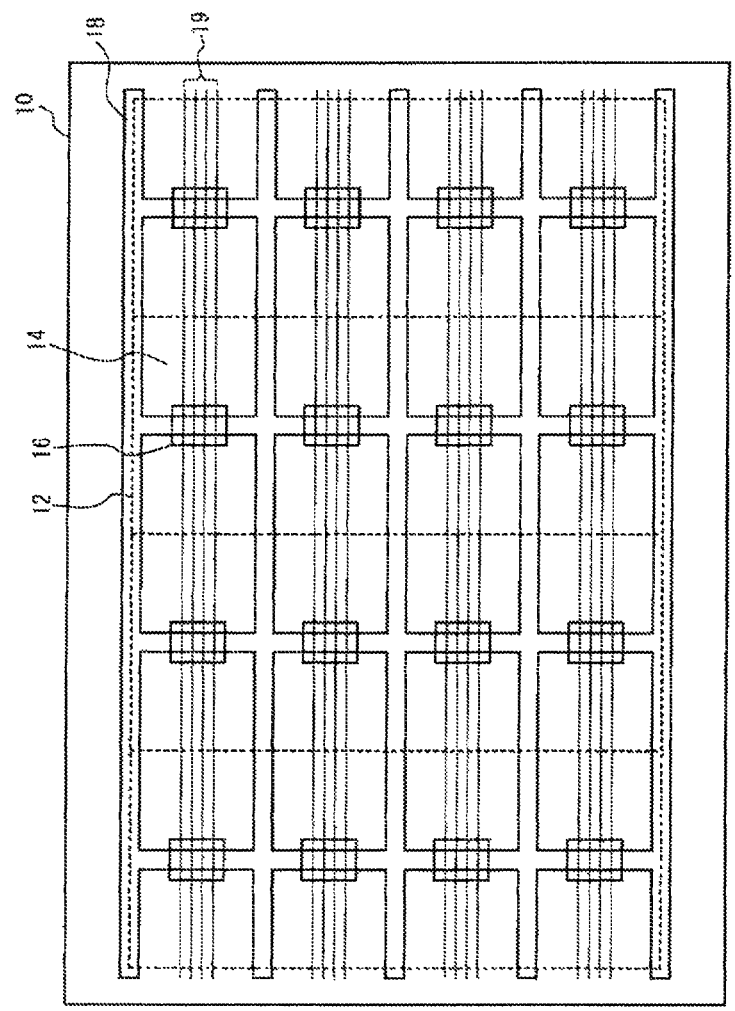
FIG. 1 is a schematic diagram of a semiconductor device in accordance with a first embodiment.

FIG. 1 is a schematic view of a semiconductor device in accordance with a first embodiment. Referring to FIG. 1, an electronic circuit is formed in a semiconductor chip 10 made of silicon, for example. The electronic circuit includes a plurality of first circuits 14, and a plurality of second circuits 16, each of which second circuits 16 corresponds to a respective one of the first circuits 14. The semiconductor chip 10 is divided into a plurality of blocks 12. At least one of the first circuits 14 is provided in each of the blocks 12. Each of the first circuits 14 is supplied with power supply voltages VSS and VDD (first and second voltages, respectively) via power supply lines 18. The power supply voltage VDD is higher than the power supply voltage VSS. The power supply voltage VSS may be the ground voltage. Each of the first circuits 14 includes a first FET, the source of which is supplied with one of the first and second voltages. For example, each of the first circuits 14 includes an FET having the source and drain to which the power supply voltages VSS and VDD are supplied, respectively. The second circuits 16 generate back bias voltages applied to the FETs. Interconnection lines 19 are connected to the second circuits 16. The interconnection lines 19 include lines for VPWC, VPWS, VNWS and VNWC, as will be described later. The power supply lines 18 and the interconnection lines 19 are metal lines made of, for example, copper or aluminum. The semiconductor chip 10 may have a size of 1 mm×1 mm to 10 mm×10 mm, for example. The blocks 12 may have a size of 100 μm×100 μm to 1 mm×1 mm, for example. In the semiconductor chip 10, the blocks 12 may be arranged in a few rows and a few columns to tens of rows and tens of columns, for example.

Figure 2:
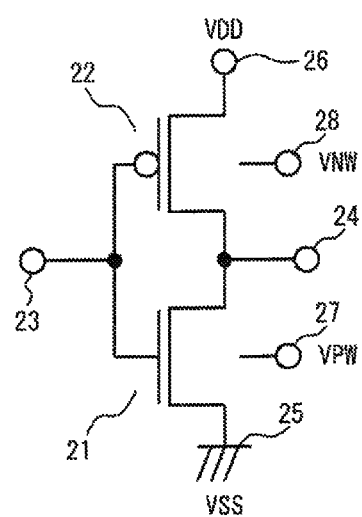
FIG. 2 is a circuit diagram of an inverter circuit that is an exemplary circuit included in a first circuit.

FIG. 2 is a circuit diagram of an inverter circuit, which is an exemplary circuit in the first circuits. Referring to FIG. 2, the inverter circuit includes FETs 21 and 22 (first FETs). FET 21 is so n-channel FET, and FET 22 is a p-channel FET. The gates of FETs 21 and 22 are commonly connected to an input node 23. The drains of FETs 21 and 22 are commonly connected to an output node 24. The source of FET 21 is connected to a power supply node 25 to which the power supply voltage VSS is applied. The source of FET 22 is connected to a power supply node 26 to which the power supply voltage VDD is applied. The back gate of FET 21 is connected to a node 27 to which a back bias voltage VPW is applied. The back gate of FET 22 is connected to a node 28 to which another back bias voltage VNW is applied.

In a case where the power supply lines 18 in FIG. 1 are long, the power supply voltages VDD and VSS drop due to the wiring resistances thereof. When the back bias voltages are supplied from the outside of the blocks 12 through interconnection lines, the back bias voltages drop. When tire power supply voltages and/or the back bias voltages change, the characteristics of FETs change. For example, when the difference between the power supply voltages decreases and the current that flows through FET decreases, the delay times of FETs increase. The delay time of each circuit is calculated with the changes in the characteristics of FETs being taken into account. When big changes in the characteristics of FETs are considered in circuit design, there is a difficulty in timing design in each circuit.

For example, in a case where the power supply voltage VDD is 0.7 V in proximity to the edges of the semiconductor chip 10, the power supply voltage is 0.7 V$-\alpha$(VDD) in the blocks 12 in the vicinity of the center of the semiconductor chip 10. The parameter $\alpha$(VDD) is a drop of the power supply voltage VDD due to the power supply lines 18. In a case where FET 22 is supplied with the back bias voltage VNW equal to VDD+0.4 V, the back bias voltage VNW in the blocks 12 in the vicinity of the center of the semiconductor chip 10 is VDD+0.4$-\alpha$(VNW). The parameter $\alpha$(VNW) is a drop of the back bias voltage VNW due to the wiring resistance. The back bias voltage Vbs applied to FET 22 is 0.4 V in proximity to the edges of the semiconductor chip 10. However, the back bias voltage Vbs in the vicinity of the center of the semiconductor chip 10 is equal to (VDD+0.4 V$-\alpha$(VNW))$-$VDD$-\alpha$(VDD))=0.4 V$-\alpha$(VNW)+$\alpha$(VDD). As described above, the different blocks 12 have different characteristics of FETs 21 and 22 due to the voltage drops in VDD and VSS and those in VNW and VPW.

Figure 3A:
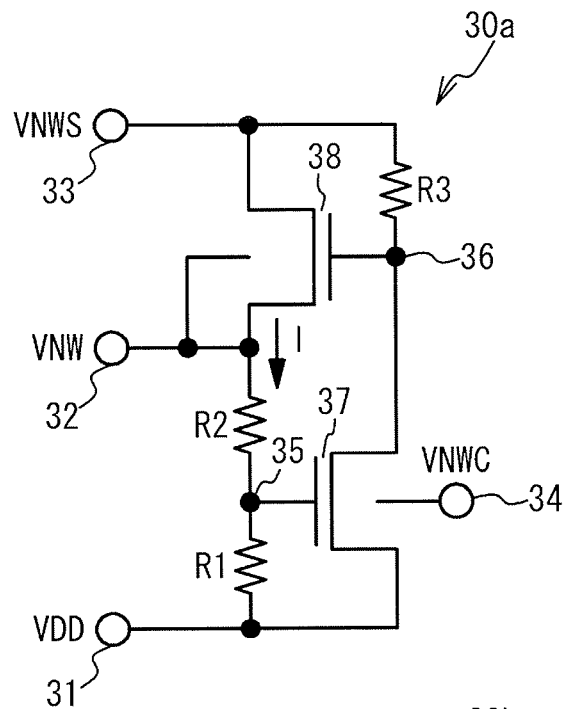
FIGS. 3A and 3B are circuit diagrams of examples of a second circuit.
Figure 3B:
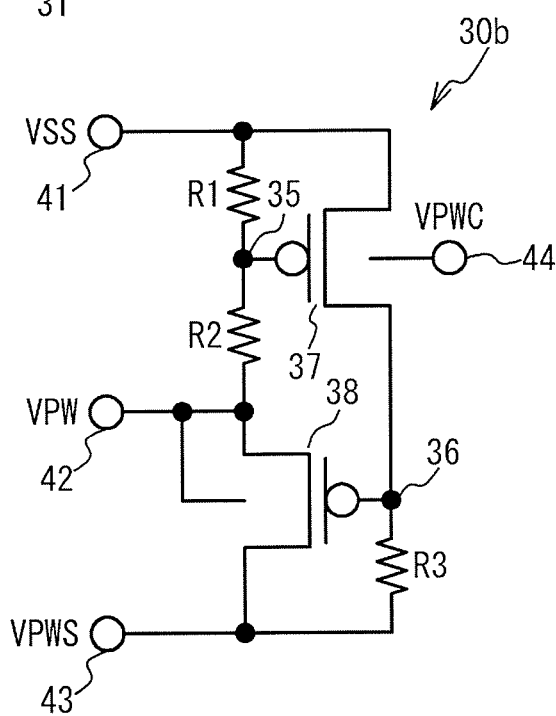

FIGS. 3A and 3B are circuit diagrams of exemplary configurations of the second circuits. Second circuits 30a and 30b generate VNW and VPW from the power supply voltages VD and VSS, respectively. The second circuits 3-a and 30b generate the back bias voltages VNW and VPW that change so as to follow the changes of the power supply voltages VDD and VSS, respectively.

Referring to FIG. 3A, the second circuit 30a has resistor R1 (first resistor), resistor R2 (second resistor) and resistor R3 (third resistor), FET 37 (second FET), and FET 38 (third FET). A node 31 (first node) is supplied with the power supply voltage VDD (second voltage). A node 33 (second node) is supplied with a voltage VNWS (third voltage). The voltage VNWS is higher than the power supply voltage VDD. The back bias voltage VNW is output via a node 23 (third node). A node 34 (fourth node) is supplied with a control voltage VNWC (fourth voltage). The resistors R1 and R2 are connected in series between the node 31 and the node 32. The source of FET 37 is connected to the node 31, and the gate is connected to a node 35 between the resistor R1 and the resistor R2, the drain being connected to the node 33. The back gate of FET 37 is connected to the node 34. The resistor R3 is connected in series between the drain of FET 37 and the node 33. The source of FET 38 is connected to the node 33, and the gate is connected to a node 36 between the drain of FET 37 and the resistor R3, the drain being connected to the node 32. FETs 37 and 38 are n-channel FETs.

FET 38 and the resistor R3 form a current source that supplies current 1 to the resistors R1 and R2. The current 1 is almost constant independent of the power supply voltages VDD and VSS. A potential difference across the resistor R1 is I×R1 where R1 is the resistance of R1. This potential difference is the gate-source voltage Vgs of FET 37. Therefore, Vgs=I×R1. The potential difference between the nodes 31 and 32 is VNW$-$VDD, and is equal to I×(R1+R2) where R2 is the resistance of R2. Thus, VNW$-$VDD=Vgs×(1+R2/R1). That is, VNW$-$VDD is a constant multiple of Vgs. The gate-source voltage Vgs is almost constant. Therefore, the potential difference VNW$-$VDD is almost constant independent of VDD and VNWS. The potential difference VNW$-$VDD is changed by changing R2/R1. By changing the control voltage VNWC, the gate-source voltage Vgs is changed. It is therefore possible to define VNW$-$VDD by the control voltage VNWC.

The back bias voltage of FET 37 is VDD$-$VNWC. If the power supply voltage VDD drops to VDD$-\alpha$, the back bias voltage of FET 37 becomes equal to VDD$-\alpha-$VNWC. Thus, the back bias voltage is reduced by the drop $\alpha$ of the power amply voltage VDD. Thus, the gate-source voltage Vgs decreases and the potential difference VNW$-$VDD decreases. Thus, the back bias voltage VNW of the p-channel FET 22 of the inverter circuit 20 decreases. Thus, the current that flows through FET 22 increases, and the current decrease of FET 22 due to the drop of the power supply voltage VDD is compensated for. Thus, the delay resulting from the drop of the power supply voltage VDD is compensated for. As described above, the second circuit 30a suppresses the influence of the drops of the power supply voltage VDD and the back bias voltage VNW. For example, the voltages VDD, VNWS, VNWC and VNWS are set equal to 0.7 V, 1.5 V, 0.3 V and 1.1 V, respectively.

Referring to FIG. 3B, in the second circuit 30b, a node 41 (first node) is supplied with the power supply voltage VSS (first voltage). A node 43 (second node) is supplied with a voltage VPWS (third voltage). The voltage VPWS is lower than the power supply voltage VSS. The back bias voltage VPW is output via a node 42 (third node). A node 44 (fourth node) is supplied with a control voltage VPWC (fourth voltage). FETs 37 and 38 are p-channel FET. The other structures of the second circuit 30b are the same as those of the second circuit 30a, and a description thereof is omitted here.

The second circuit 30b is capable of keeping VPW$-$VSS almost constant independent of VSS and VPWS. The VPW$-$VSS is changed by changing R2/R1. Further, VPW$-$VSS is defined by the control voltage VPWC. Furthermore, it is possible to compensate for the drop of the power supply voltage VSS and the decrease in the current that flows through FET 21. Thus, the second circuit 30b is capable of suppressing the influences of the drops of the power supply voltage VSS and the back bias voltage VPW. For example, the voltages VSS, VPWS, VPWC and VPWS are set equal to 0.0 V, $-$0.8 V, 0.4 V and $-$0.4 V, respectively.

Figure 4:
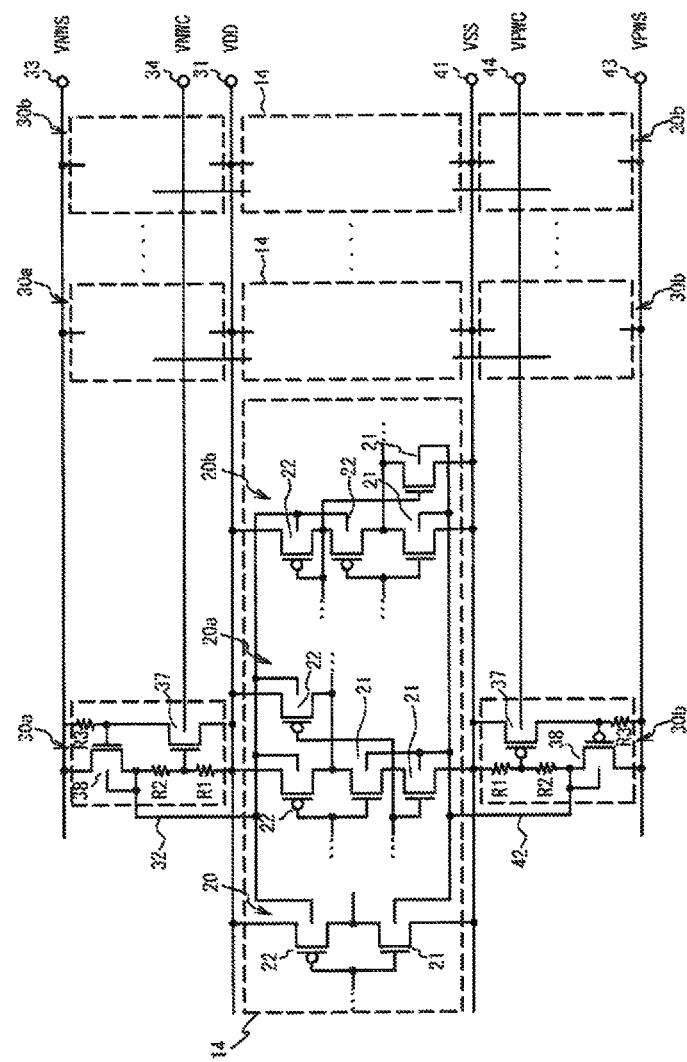
FIG. 4 is a circuit diagram of a part of a circuit in accordance with the first embodiment.

FIG. 4 is a circuit diagram of a part of a circuit in accordance with the first embodiment. Referring to FIG. 4, each of the first circuits 14 has logic circuits such as an inverter circuit 20, a NAND circuit 20a and a NOR circuit 20b. The back bias voltages of the n-channel FETs 21 in the first circuit 14 are the back bias voltage VFW generated by the corresponding second circuit 30b. The back bias voltages of the p-channel FETs 22 in the first circuit 14 are the back bias voltage VNW generated by the corresponding second circuit 30a. Each of the first circuits 14 is supplied with the back bias voltages VNW and VPW generated by the corresponding one of the second circuits 30a and the corresponding one of the second circuits 30b, respectively.

Figure 5:
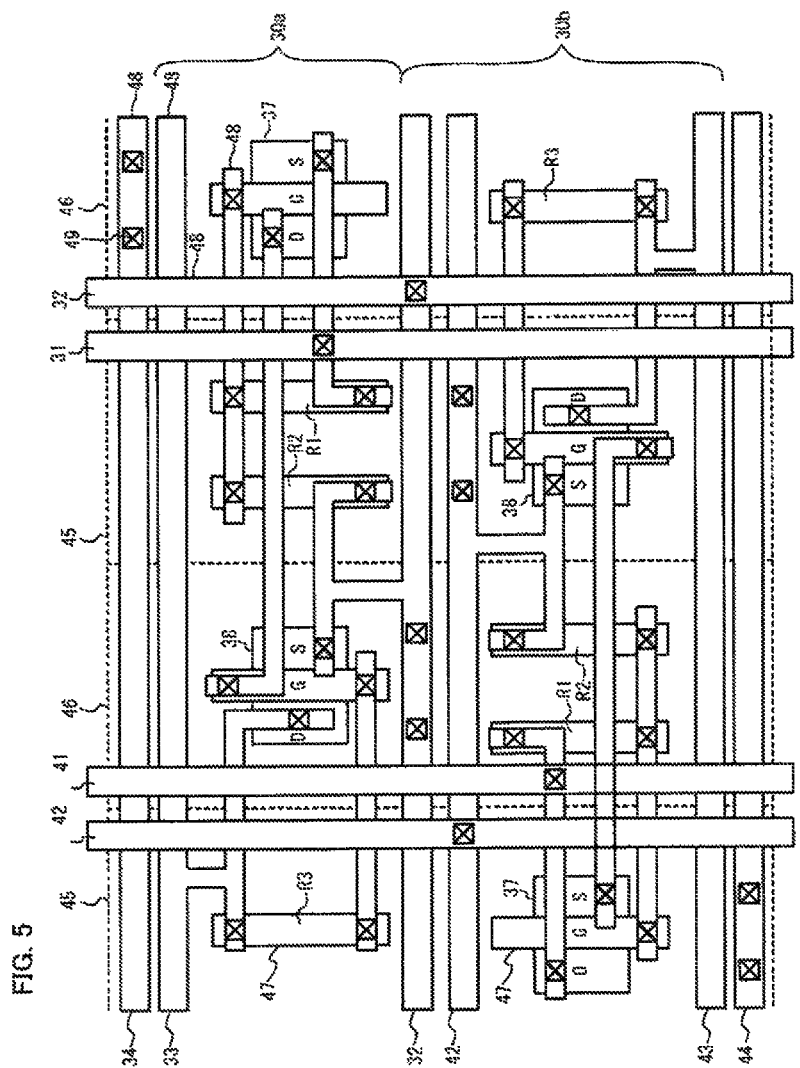
FIG. 5 is a diagram of a layout of the second circuit.

FIG. 5 is a diagram of a layout of the second circuits. Referring to FIG. 5, N-wells 45 and P-wells 46 are formed in the semiconductor chip 10, more specifically, in a semiconductor substrate. The FETs 37 and 38 of the second circuits 30a are formed in the P-wells 46, and the FETs 37 and 38 of the second circuits 30b are formed in the N-wells 45. The resistors R1 through R3 and the gates of FETs 37 and 38 include polysilicon layers 47. In the second circuits 30a, the source S of FET 37 is connected, via interconnection lines 48 and contacts 49, to a power supply line (note 31) to which the power supply voltage VDD is supplied. Further, the source S is connected to one end of the resistor R1. The gate G of FET 37 is connected to the other end of the resistor R1 and one end of the resistor R2 via the corresponding interconnection line 48 and contacts 49. The drain D of FET 37 is connected to the gate G of FET 38 via the corresponding interconnection line 48 and contacts 49. The P-well 46 in which FET 37 is formed is connected to the interconnection line (note 34) through which the control voltage is supplied via the contacts 49.

The other end of the resistor R2 is connected to the output interconnection line (node 32) that carries the back bias voltage VNW and the source S of FET 38 via the corresponding interconnection line 48 and contacts 49. The gate G of FET 38 is connected to one end of the resistor R3 via the corresponding interconnection hue 48 and contacts 49. The drain D of FET 38 is connected to the other end of the resistor R3 and the interconnection line (power supply node 33) through which the voltage VNWS is supplied via the corresponding interconnection line 48 and contacts 49. The P-well 46 in which FET 38 is formed is connected to the interconnection line (node 32) via the contacts 49.

Parts of the interconnection lines 48 are formed above parts of the resistors R1 and R2. The parts of the resistors R1 and R2 extend in the same direction as that in which the parts of the interconnection lines 48 extend. Thus, the resistance ratio R2/R1 may be arbitrarily set by selecting the positions of the contacts 49 that establish the interconnections between the resistors R1 and R2 and the interconnection lines 48.

In the second circuit 30b, FETs 37 and 38 are formed in the N-well 45. The other structures of the second circuit 30b are the same as those of the second circuit 30a, and a description thereof is omitted here.

FIGS. 6A and 6B are graphs that illustrate simulation results of the second circuits. In the simulation, the gate lengths of FETs 37 and 38 are set equal to 60 nm, and the gate widths thereof are set equal to 5 µm. The resistance of the resistor R3 is 10 kΩ. The voltages VNWS and VFWS are set equal to 1.5 V and −0.7 V respectively. The control voltages VNWC and VPWC are set equal to 0.4 V and 0.3 V, respectively. At room temperature (around 25° C.), the resistance ratio R2/R1 is changed.

FIG. 6A is a graph of the back bias voltage VNW associated with time. Referring to FIG. 6A, in the second circuit 30a, the power supply voltage VDD is changed from 0.7 V to 0.5 V as the time passes. The resistance ratio R2/R1 is set to 1, 0.5 and 0.1. The difference VDD−VNW is almost constant irrespective of the different values or changes of the power supply voltage VDD. The difference VDD−VNW is defined by the resistance ratio R2/R1.

FIG. 6B is a graph of the back bias voltage VPW associated with time. Referring to FIG. 6B, in the second circuit 30b, the power supply voltage VSS is changed from 0 V to 0.2 V as the time passes. The resistance ratio R2/R1 is set to 1, 0.5 and 0.1. The difference VSS−VPW is almost constant irrespective of the different values of the power supply voltage VSS. The difference VSS−VPW is defined by the resistance ratio R2/R1.

FIGS. 7A and 7B are graphs that illustrate simulation results of the second circuits. In the simulation, the gate lengths of FETs 37 and 38 are set equal to 60 nm, and the gate widths thereof are set equal to 5 µm. The resistance of the resistor R3 is 10 kΩ. The voltages VNWS and VFWS are set equal to 1.5 V and −0.7 V, respectively. The resistance ratio R2/R1 is set to 0.1. At room temperature (around 25° C.), the control voltages VNWC and VPWC are changed.

FIG. 7A is a graph of the back bias voltage VNW associated with time. Referring to FIG. 7A, in the second circuit 30a, the power supply voltage VDD is changed form 0.7 V to 0.5 V as the time passes. The control voltage VNWC is set to 0.1 V, 0.3 V, 0.5 V and 0.7 V. The difference VDD−VNW is almost constant irrespective of the different values of the power supply voltage VDD. The difference VDD−VNW is defined by the control voltage VNWC.

FIG. 7B is a graph of the back bias voltage VPW associated with time. Referring to FIG. 7B, in the second circuit 30b, the power supply voltage VSS is changed from 0.0 V to 0.2 V as the time passes. The control voltage VPWC is set to 0 V, 0.2 V 0.4V and 0.6 V. The difference VSS−VPW is almost constant irrespective of the different values of the power supply voltage VDD. The difference VSS−VPW is defined by the control voltage VPWC.

According to the first embodiment, the second circuit 16 composed of the second circuits 30a and 30b is provided for each of the first circuits 14. The second circuit 16 generates the back bias voltages VNW and VPW that change in response to the changes of the power supply voltages VDD and/or VSS and are applied to the FETs included in the second circuit 30. With this structure, the back bias voltage VDD−VNW and/or VSS−VPW supplied to the first circuits 14 is kept constant irrespective of the changes of the power supply voltages VDD and VSS and/or the voltages VNW and VPW. Therefore, each of the circuits that control the back bias voltages applied for the respective first circuits 14 is simplified.

The circuit is designed to have an arrangement in which at least two of the first circuits 14 have different values of the resistance ratio R2/R1. Thus, the first circuits 14 have the different back bias voltages. Thus, the first circuits 14 having different characteristics are realized by using the different values of the resistance ratio R2/R1. For example, the different values of the resistance ratio R2/R1 realize a characteristic of the first circuits 14 having an increased FET current and a reduced delay time, and another characteristic having a reduced FET current and an increased delay time.

The circuit is designed to have an arrangement in which at least two of the first circuits 14 have different values of the control voltages VNWC and VPWC. With this arrangement, each of the first circuits 14 have the respective, different back bias voltages. For example, the different values of the control voltages VNWC and VPWC realize a characteristic of the first circuits 14 having an increased FET current and a reduced delay time, and another characteristic having a reduced FET current and an increased delay time.

Second Embodiment

Figure 8:
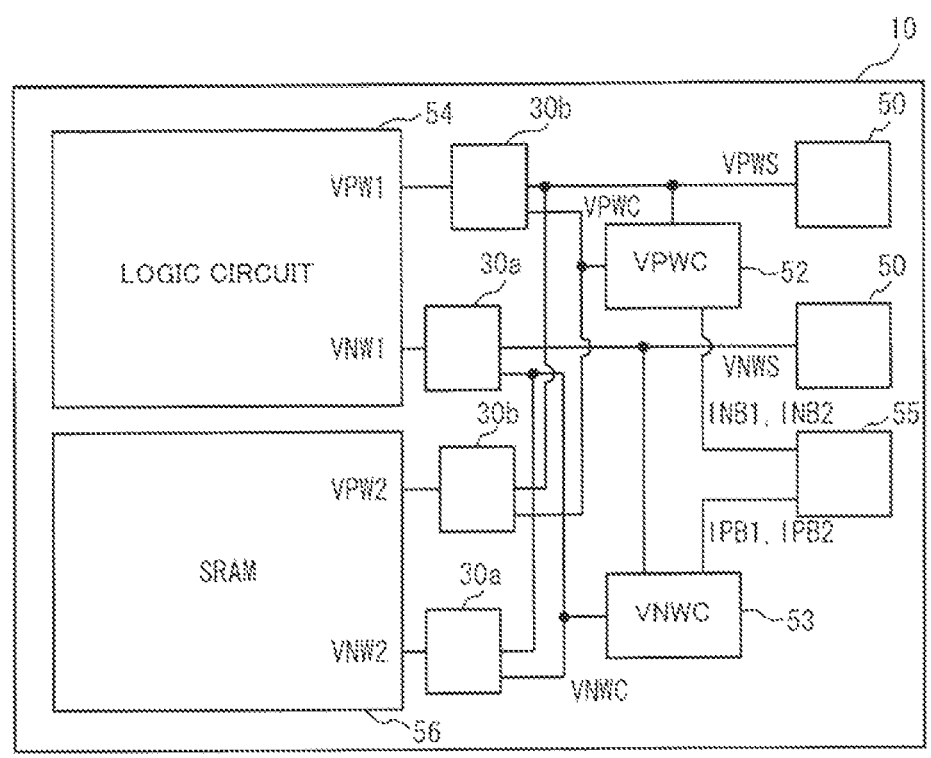
FIG. 8 is a block diagram of a semiconductor device in accordance with a second embodiment.

FIG. 8 is a block diagram of a semiconductor device is accordance with a second embodiment. Referring to FIG. 8, in the semiconductor chip 10, there are provided a logic circuit 54 and an SRAM (Static Random Access Memory) 56 as the first circuits. Further, in the semiconductor chip 10, provided are charge pumps 50, a VPWC generating circuit 52, a VNWC generating circuit 53, a memory circuit 55, and the second circuits 30a and 30b. Each of the two charge pumps 50 generates the voltages VPWS and VNWS. The VFWC generating circuit 52 and the VNWC generating circuit 53 generate the control voltages VFWC and VNWC from the voltages VPWS and VNWS. The two second circuits 30a generate back bias voltages VNW1 and VNW2, respectively. The two second circuits 30b generate back bias voltages VPW1 and VPW2, respectively. The back bias voltages VNW1 and VPW1 are supplied to the logic circuit 54. The back bias voltages VNW2 and VPW2 are supplied to the SRAM 56.

The back bias voltages VNW1 and VNW2 may be changed so as to have different values with different values of the resistance ratio R2/R1 of the two second circuits 30a. Similarly, the back bias voltages VPW1 and VPW2 may have different values with different values of the resistance ratio R2/R1 of the two second circuits 30b. The memory circuit 55 stores information INB1, INB2, IPB1 and IPB2 associated with the control voltages. The VPWC generating circuit 52 generates the control voltage VPWC on the basis of information IPB1 and IPB2. The VNWC generating circuit 53 generates the control voltage VNWC on the basis of the information INB1 and INB2. The memory circuit 55 is a non-volatile memory, for example.

Figure 9:
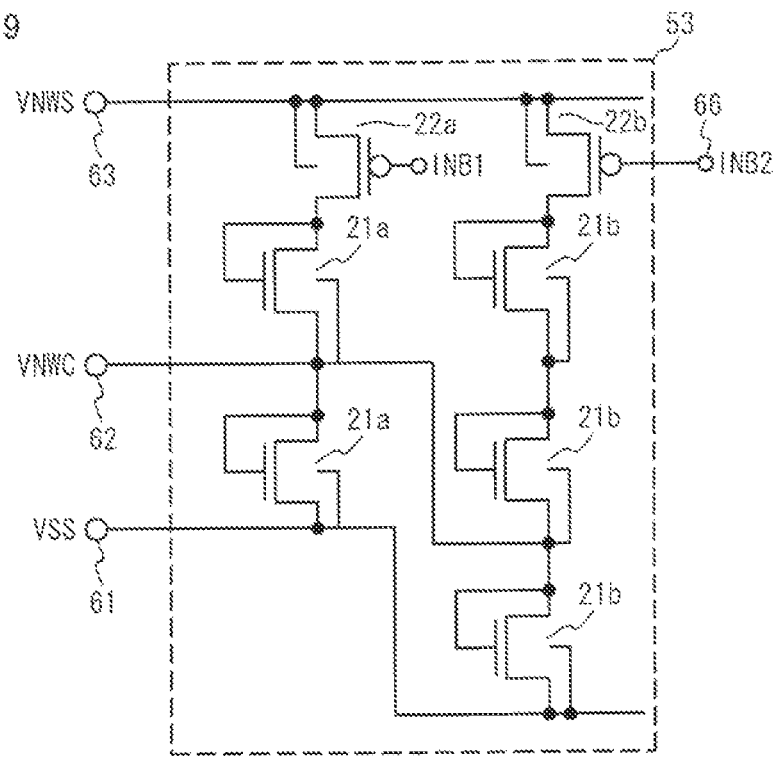
FIG. 9 is a circuit diagram of a VNWC generating circuit.

FIG. 9 is a circuit diagram of the VNWC generating circuit 53. Referring to FIG. 9, one p-channel FET 22a and two n-channel FETs 21a are connected in series between a node 63 to which the voltage VNWS is supplied and a node 61 to which the power supply voltage VSS is supplied. Further, one p-channel FET 22b and three n-channel FETs 21b are connected in series. To the node 62 to which the control voltage VNWC is output, connected are a node between the two FETs 21a and a node that divides the three FETs 21b into 2:1. Therefore, the divided voltage by the two FETs 21a and that by the three FETs 21b are different from each other. The gates of FETs 22a and 22b are supplied with the information INB1 and INB2, respectively. The number of FETs 21a connected in series is different from that of FETs 21b connected in series. Thus, the control voltage VNWC is defined on the basis of the information INB1 and INB2. The VPWC generating circuit 52 may be configured similarly. The VPWC generating circuit 52 defines the control voltage VPWC on the basis of the information IPB1 and IPB2.

In the logic circuit 54, the currents that flow through FETs are increased to thus reduce the delay time. In contrast, the SRAM 56 is configured to have reduced currents that flow through FETs for the purpose of power consumption. Thus, the semiconductor device is configured so that the back bias voltages applied to the FETs in the logic circuit 54 are different from those applied to the FETs in the SRAM 56. In case where the second circuits 30a and 30b are not provided, four charge pumps 50 will be used to generate the four back bias voltages of VNW1, VNW2, VPW1 and VPW2. In this case, the charge pumps 50 have large areas, which lead to a large chip size. On the contrary, according to the second embodiment, the two second circuits 30a have different values of the resistance ratio R2/R1, and generate mutually different back bias voltages VNW1 and VNW2. Similarly, the two second circuits 30b have different values of the resistance ratio R2/R1, and generate mutually different back bias voltages VPW1 and VPW2. Thus, the four bias voltages VNW1, VNW2, VPW1 and VPW2 are generated with only the two charge pumps 50. As described above, the second embodiment realizes a reduced number of charge pumps 50 and a reduced chip size.

The memory circuit 55 stores the information INB1, INB2, IPB1 and IPB2 that correspond to the control voltages. Thus, the control voltages VNWC and VPWC may be set for each semiconductor chip 10. For example, the control voltages VNWC and VPWC may be set for each semiconductor chip 10 separately in order to absorb differences in the characteristics caused in the manufacturing process.

The voltages generated by the charge pumps 50 may change with time. When, the back bias voltages VNW and VPW are generated by the charge pumps, the back bias voltages VNW and VPW change with time. When such back bias voltages VNW and VPW are used for a PLL (Phase Logic Loop) circuit, the jitter characteristic is degraded. Therefore, the back bias voltages VNW and VPW are not supplied to analog circuits including the PLL circuit. Thus, the analog circuit consumes a large amount of power.

On the contrary, according to the second embodiment, the charge pumps 50 generate the voltages VNWS and VPWS. The second circuits 30a and 30b generate the back bias voltages VNW and VPW form the voltages VNWS and VPWS. Thus, fluctuations in VNW are suppressed even if VNWS fluctuates considerably.

Figure 10:
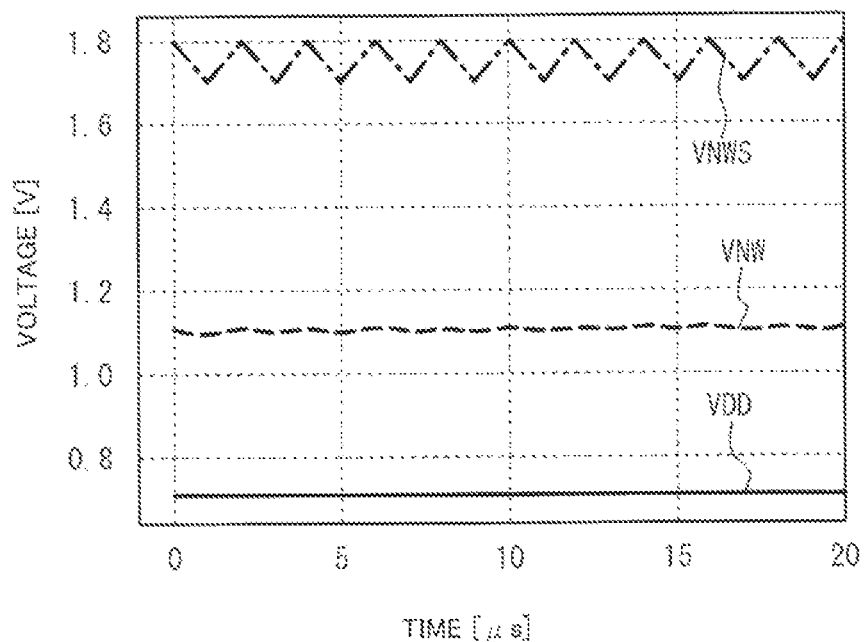
FIG. 10 is a diagram of simulation results of VNWS and VNW and time.

FIG. 10 is a schematic diagram of VNWS and VNW with time. Referring to FIG. 10, the charge pumps 50 generate the voltages VNWS. Therefore, if the voltages VNWS have a ripple of about 0.1 V, the voltages VNW are unproved to have a ripple of about 0.01 V. In the above-described manner, the ripples included in the back bias voltages VNW and VPW are suppressed.

Figure 11:
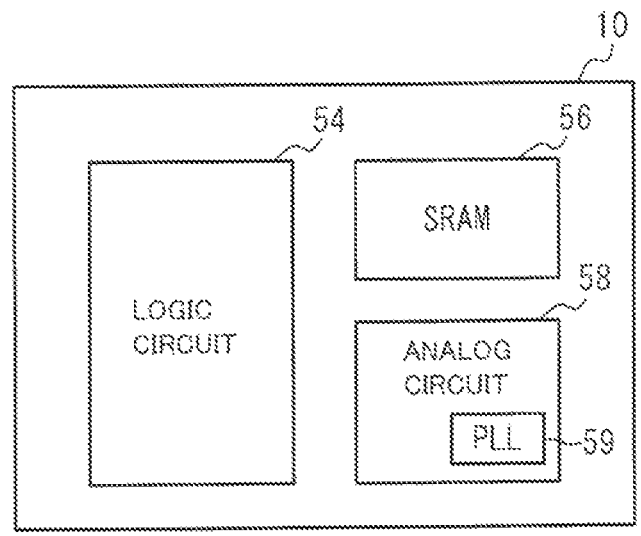
FIG. 11 is a schematic diagram of another example of the semiconductor device in accordance with the second embodiment.

FIG. 11 is a schematic diagram of another example of the semiconductor device in accordance with the second embodiment. Referring to FIG. 11, in the semiconductor chip 10, provided are the logic circuit 54, the SRAM 56 and an analog circuit 58, as the first circuits. The analog circuit 58 includes a PLL circuit 59. At least one of the first circuits 14 may include the PLL circuit 59. Therefore, the back bias voltages VNW and VPW are supplied to the first circuit 14 including the PLL circuit 59. Thus, the power consumption in the first circuit 14 including the PLL circuit 59 is reduced.

Third Embodiment

Figure 12:
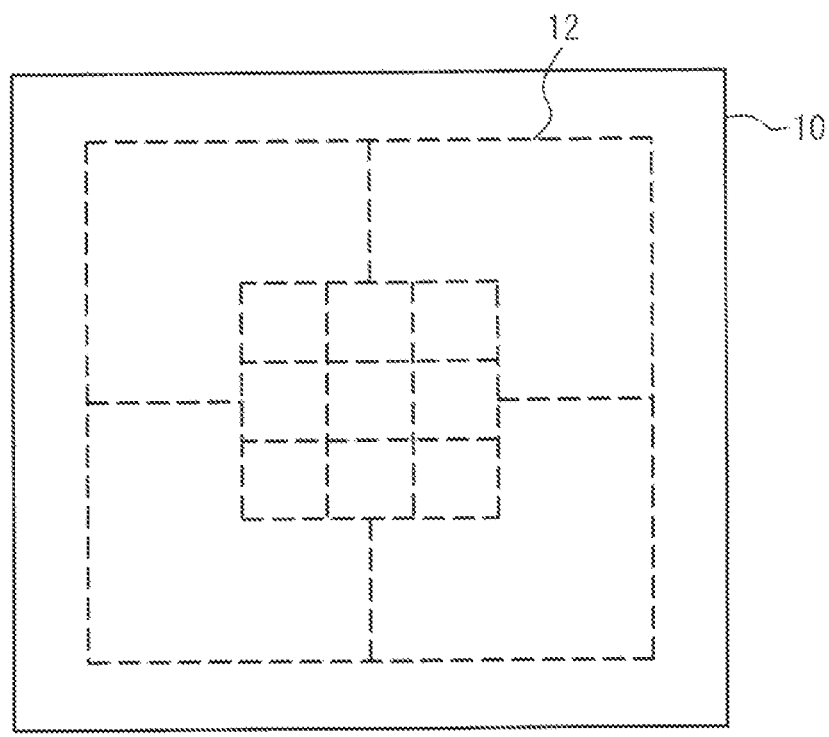
FIG. 12 is a schematic diagram of a semiconductor device in accordance with a third embodiment.

FIG. 12 is a schematic view of a semiconductor device in accordance with a third embodiment. Referring to FIG. 12, the plurality of blocks 12 include blocks that are located in the vicinity of the center of the semiconductor chip 10 and have smaller areas than those of blocks located in proximity to the edges of the semiconductor chip 10. The voltage drops of, for example, power supplies are comparatively large in the vicinity of the chip center. Therefore, in proximity to the chip edges having comparatively small voltage drops, the back bias voltages are not controlled as much as those controlled in vicinity of the chip center. The setting of the blocks 12 may be arbitrarily carried out in accordance with the circuit type and/or circuit arrangement.

Although the above-described first through third embodiments have exemplary circuit configurations with the second circuits 30a and 30b, these embodiments may be changed so as to have either the second circuits 30a or 30b.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An electronic circuit comprising:
a first power supply line;
a second power supply line configured to be located along the first power supply line;
a plurality of first circuits each including a first FET and configured to be located along the first power supply line and the second power supply line, each of the plurality of first circuits connected to a first power supply node through the first power supply line, and connected to a second power supply node through the second power supply line, a first power supply voltage applied to the first power supply node being changed into changed first power supply voltages based on a distance from the first power supply node to each of the plurality of first circuits, a second power supply voltage applied to the second power supply node being changed into changed second power supply voltages based on a distance from the second power supply node to each of the plurality of first circuits, each of the plurality of first circuits being supplied with a respective one of the changed first power supply voltages and a respective one of the changed second power supply voltages, the first FET of each of the plurality of first circuits having a source supplied with at least one of the respective one of the changed first voltages and the respective one of the changed second power supply voltages; and
a plurality of second circuits each being associated with a respective one of the first circuits, located along the first power supply line and the second power supply line, and each configured to generate a back bias voltage applied to the first FET of the respective one of the first circuits, so that the back bias voltage changes in accordance with at least one of the respective one of the changed first power supply voltages and the respective one of the second power supply voltages.

2. The electronic circuit according to claim 1, wherein each of the plurality of second circuits includes a first node supplied with one of the respective one of the changed first power supply voltages and the respective one of the changed second power supply voltages, a second node supplied with a third voltage that is lower than the respective one of the changed first power supply voltages or higher than the respective one of the changed second power supply voltages, a third node via which the back bias voltage is output, a fourth node supplied with a fourth voltage, first and second resistors connected in series between the first node and the second node, a second FET having a source connected to the first node, a gate connected to a node between the first resistor and the second resistor, a drain connected to the second node, and a back gate connected to the fourth node, and a current source that is connected between the second node and the third node and supplies current to the first and second resistors.

3. The electronic circuit according to claim 2, wherein the current source includes a third resistor connected between the drain of the second FET and the second node, and a third FET having a source connected to the third node, a gate connected between the drain of the first FET and the third resistor, and a drain connected to the second node.

4. The electronic circuit according to claim 2, wherein at least two of the plurality of second circuits have different values of a resistance ratio between the first resistor and the second resistor.

5. The electronic circuit according to claim 2, wherein at least two of the plurality of second circuits are supplied with different values of the fourth voltage.

6. The electronic circuit according to claim 2, further comprising a charge pump generating the third voltage.

7. The electronic circuit according to claim 2, further comprising a memory circuit that stores information about the fourth voltage, and a generating circuit that generates the fourth voltage on the basis of the information.

8. The electronic circuit according to claim 7, wherein at least one of the plurality of first circuits includes a PLL circuit.

9. The electronic circuit according to claim 2, wherein:
the first node is supplied with the respective one of first power supply voltages;
the first FET is an n-channel FET;
the second FET is a p-channel FET; and
the third voltage is lower than the respective one of first power supply voltages.

10. The electronic circuit according to claim 2, wherein:
the first node is supplied with the respective one of second power supply voltages;
the first FET is a p-channel FET;
the second FET is an n-channel FET; and
the third voltage is higher than the respective one of second power supply voltages.

11. The electronic circuit according to claim 4, further comprising a single charge pump generating the third voltage and supplying the third voltage to the at least two of the second circuits.

12. The electronic circuit according to claim 1, wherein
the first power supply voltage is changed into the changed first supply voltage by wiring resistance of the first power supply line; and
the second power supply voltage is changed into the changed second supply voltage by wiring resistance of the second power supply line.

13. The electronic circuit according to claim 12, wherein
each length of the first power supply line from the first power supply node to each first circuit of the plurality of first circuits is different each other; and
each length of the second power supply line from the second power supply node to each first circuit of the plurality of first circuits is different each other.

14. A semiconductor device comprising a semiconductor chip in which an electronic circuit is formed,
the electronic circuit including:
a first power supply line;
a second power supply line configured to be located along the first power supply line;
a plurality of first circuits each including a first FET and configured to be located along the first power supply line and the second power supply line, each of the plurality of first circuits connected to a first power supply node through the first power supply line, and connected to a second power supply node through the second power supply line, a first power supply voltage applied to the first power supply node being changed into changed first power supply voltages based on a distance from the first power supply node to each of the plurality of first circuits, a second power supply voltage applied to the second power supply node being changed into changed second power supply voltages based on a distance from the second power supply node to each of the plurality of first circuits, each of the plurality of first circuits being supplied with a respective one of the changed first power supply voltages and a respective one of the changed second power supply voltages, the first FET of each of the plurality of first circuits having a source supplied with at least one of respective one of the changed first and the respective one of the changed second power supply voltages; and a plurality of second circuits each being associated with a respective one of the first circuits, located along the first power supply line and the second power supply line, and each configured to generate a back bias voltage applied to the first FET of the respective one of the first circuits, so that the back bias voltage changes in accordance with at least one of the respective one of the changed first power supply voltages and the respective one of the second power supply voltages, the semiconductor chip having a plurality of blocks, each of which includes the first circuits.

15. The semiconductor device according to claim 14, wherein the plurality of blocks include blocks that are arranged in a vicinity of a center of the semiconductor chip and have smaller areas than those of blocks arranged in proximity to edges of the semiconductor chip.

* * * * *